(12) United States Patent
Yoo et al.

(10) Patent No.: US 7,169,517 B2
(45) Date of Patent: Jan. 30, 2007

(54) METHOD OF FABRICATING A COLOR FILTER IN LIQUID CRYSTAL DISPLAY DEVICE WITHOUT USING A PHOTO MASK

(75) Inventors: Hong-Suk Yoo, Gyeonggi-Do (KR); Myoung-Kee Baek, Gyeonggi-Do (KR)

(73) Assignee: LG Philips LCD Co., Ltd., Seoul (KR)

( * ) Notice: Subject to any disclaimer, the term of this patent is extended or adjusted under 35 U.S.C. 154(b) by 445 days.

(21) Appl. No.: 10/677,552

(22) Filed: Oct. 1, 2003

(65) Prior Publication Data

US 2004/0126679 A1    Jul. 1, 2004

(30) Foreign Application Priority Data

Dec. 27, 2002    (KR) .................. 10-2002-0085633

(51) Int. Cl.
*G02B 5/20*    (2006.01)
*G02F 1/1335*    (2006.01)

(52) U.S. Cl. ........................................ 430/7; 101/170
(58) Field of Classification Search ................ None
See application file for complete search history.

(56) References Cited

U.S. PATENT DOCUMENTS

| | | | |
|---|---|---|---|
| 4,294,650 A | 10/1981 | Werthmann | |
| 5,259,926 A | 11/1993 | Kuwabara et al. | |
| 5,514,503 A | 5/1996 | Evans et al. | |
| 5,544,582 A | 8/1996 | Bocko et al. | |
| 5,678,483 A | 10/1997 | Johnson | |
| 5,701,815 A | 12/1997 | Bocko et al. | |
| 5,721,076 A * | 2/1998 | Watanabe et al. | 430/7 |
| 6,001,515 A | 12/1999 | Evans et al. | |
| 6,356,318 B1 | 3/2002 | Kawahata | |

FOREIGN PATENT DOCUMENTS

| | | |
|---|---|---|
| EP | 0 471 628 A1 | 3/1991 |
| JP | 63-205608 | 8/1988 |
| JP | 03-280416 | 12/1991 |
| JP | 04-094115 | 3/1992 |
| JP | 04-239684 | 8/1992 |
| JP | 04-249189 | 9/1992 |
| JP | 04-296724 | 10/1992 |
| JP | 05-011270 | 1/1993 |
| JP | 06-202314 | 7/1994 |
| JP | 07-240523 | 9/1995 |
| JP | 9-318804 A * | 12/1997 |

\* cited by examiner

*Primary Examiner*—John A. McPherson
(74) *Attorney, Agent, or Firm*—Brinks Hofer Gilson & Lione

(57) ABSTRACT

A method is presented for fabricating a color filter of a liquid crystal display (LCD) device without using a photo mask. The method includes providing a transparent substrate, depositing a color filter film on the substrate, forming a mask pattern which exposes a part of the color filter film, irradiating the surface of the color filter film, and applying developer to the color filter film to remove the unexposed color filter film and the mask pattern.

42 Claims, 6 Drawing Sheets

METHOD OF FABRICATING A COLOR FILTER IN LIQUID CRYSTAL DISPLAY DEVICE WITHOUT USING A PHOTO MASK

BACKGROUND OF THE INVENTION

1. Field of the Invention

The present invention relates to a liquid crystal display (LCD) device, and more particularly, to a fabrication method of a color filter of an LCD device which can simplify processes and reduce the cost of fabrication by not using a photo mask.

2. Description of the Related Art

Recently, various portable electric devices such as mobile phones, personal digital assistants (PDA), and notebook computers have been developed, and therefore, the needs for a flat panel display device used in small, light weight, and power-efficient devices for such portable devices have correspondingly increased. To meet such needs, flat panel display device technologies such as liquid crystal display (LCD) technology, plasma display panel (PDP) technology, field emission display (FED) technology, and vacuum fluorescent display (VFD) technology have been actively researched. Of these flat panel display devices, the LCD is most prevalent due to available mass production techniques, efficient driving schemes, and superior image quality.

FIG. 1 is a schematic view showing a sectional surface of a general LCD device. As shown in FIG. 1, the LCD 1 comprises a lower substrate 5, an upper substrate 3, and a liquid crystal layer 7 formed between the lower substrate 5 and the upper substrate 3. The lower substrate 5 is a driving device array substrate. A plurality of pixels (not shown) are formed on the lower substrate 5, and a driving device such as a thin film transistor (TFT) 9 is formed on each pixel. The upper substrate 3 is a color filter substrate, and a color filter layer for reproducing real color is formed thereon. Further, a pixel electrode 6 and a common electrode are formed on the lower substrate 5 and the upper substrate 3, respectively. An alignment layer is formed on the lower substrate 5 and the upper substrate 3 to align liquid crystal molecules of the liquid crystal layer 7 uniformly.

The lower substrate 5 and the upper substrate 3 are attached by a sealing material (not shown), and the liquid crystal layer 7 is formed therebetween. In addition, the liquid crystal molecules are reoriented by the driving device formed on the lower substrate 5 to control the amount of light transmitted through the liquid crystal layer, thereby displaying information.

Fabrication processes for a LCD device can be divided into a driving device array substrate process for forming the driving device on the lower substrate 5, and a color filter substrate process for forming the color filter on the upper substrate 3.

At first, a plurality of gate lines and data lines are arranged on the lower substrate to define a pixel area by the driving device array process and the thin film transistor connected to the both gate line and the data line is formed on the each pixel area. Also, a pixel electrode, which is connected to the thin film transistor to drive the liquid crystal layer according to a signal applied through the thin film transistor, is formed by the driving device array process.

Also, the color filter process forms the black matrix 8 on the upper substrate 3, forms the color filter 2 on upper part of the black matrix 8, and forms the common electrode 4 on the color filter.

There are methods for fabricating the color filter such as a pigment dispersing method and an electrophoresis deposition method. In particular, the pigment disperse method forms the color filter by coating, exposing, developing and burning pigment composition dispersed on a photoresist. The fabrication method of color filter using the pigment disperse method will be described with reference to FIG. 2.

First, as shown in FIG. 2A, a transparent substrate 21 is provided, material for forming the black matrix such as chrome and organic material is coated on the substrate 21, and after that, a black matrix pattern 22 is formed using a photolithographic process. Next, as shown in FIG. 2B, material for forming red color filter film 23 is coated thereon, and a predetermined area is exposed using a photo mask 28 and developed to form the red color filter film 23a as shown in FIG. 2C. After that, the above process is repeated using materials for green and blue color filters instead of using the red color filter film material, and, the green and blue color filter films 23b and 23c are respective formed as shown in FIG. 2d. The R, G and B color filter film 23 is thus completed.

However, in the fabrication method of the color filter according to the related art, an expensive photo mask is used, and photolithographic processes such as the color filter coating, exposure and development are repeatedly performed. Therefore, the fabrication cost is increased.

SUMMARY OF THE INVENTION

Therefore, embodiments of the present invention provide a fabrication method of a color filter of a liquid crystal display (LCD) device which can simplify processes and reduce the fabrication cost.

To achieve these and other advantages and in accordance with the present invention, as embodied and broadly described herein, there is provided a method for fabricating a color filter of a liquid crystal display (LCD) device comprising providing a transparent substrate; depositing a color filter film on the substrate; forming a mask pattern on the color filter film, a first region of the color filter film being covered by the mask pattern and a second region of the color filter film being free of coverage by the mask pattern; and removing the first region of the color filter film and the mask pattern.

The method may further comprise irradiating the color filter film prior to removing the first region of the color filter film and/or applying developer to the color filter film to remove the first region of the color filter film and the mask pattern. The mask pattern may be formed of a black resin.

Forming the mask pattern may comprise printing the mask pattern on the color filter film. In this case, printing the mask pattern may further comprise providing a cliché including a plurality of grooves; filling at least one of the grooves of the cliché with opaque material; and applying the opaque material filled in the at least one of the grooves of the cliché to the color filter film. Applying the opaque material onto the color filter film may comprise transferring the opaque material filled in the at least one of the grooves of the cliché to a transfer apparatus; and applying the opaque material to the color filter film using the transfer apparatus. In this case, the transfer apparatus may comprise a printing roller, transferring the opaque material filled in the at least one of the grooves of the cliché to the transfer apparatus may comprise rotating the printing roller on the cliché, and applying the opaque material to the color filter film may comprise rotating the printing roller containing the opaque material on the color filter film. The color filter film may be deposited on the substrate using lamination.

An opaque matrix may be formed on the color filter. In this case, forming the opaque matrix may comprise providing a cliché including a plurality of grooves; filling opaque material into at least one of the grooves of the cliché; transferring the opaque material filled into the at least one of the grooves of the cliché to a transfer apparatus; and applying the opaque material to the color filter film using the transfer apparatus to form the opaque matrix on the color filter. The opaque material may be filled in each of the grooves of the cliché. The transfer apparatus may comprise a printing roller, transferring the opaque material filled in the at least one of the grooves of the cliché to the transfer apparatus may comprise rotating the printing roller on the cliché, and applying the opaque material to the color filter film may comprise rotating the printing roller containing the opaque material on the color filter film.

The method may further comprise disposing an amount of the opaque material that will more than fill the at least one of the grooves on a surface of the cliché and pulling the opaque material into the at least one of the grooves. In this case, the method may further comprise pulling the opaque material into the at least one of the grooves using a blade to flatten the opaque material into the at least one of the grooves and removing the excess opaque material from the surface of the cliché. The method may further comprise pulling the blade in a direction that is essentially along the longest length of the at least one of the grooves.

In another embodiment, a method for fabricating a color filter of a liquid crystal display (LCD) device comprises: forming an opaque matrix on a transparent substrate; depositing a plurality of color filter films on the opaque matrix; and after each color filter film is deposited, printing a mask pattern on the color film and removing the mask pattern and a portion of the color film to form a color filter pattern.

The method may further comprise irradiating each color filter film prior to removing the mask pattern and portion of the color film and/or applying developer to each color filter film to remove the mask pattern and portion of the color film. In the latter case, each mask pattern may be formed of an opaque material that is opaque to radiation used to irradiate each color filter film.

Forming the mask pattern may comprise printing the mask pattern on each color filter film. Each mask pattern may be printed over different portions of the substrate. In this case, printing the mask pattern on each color filter film may comprise: providing a cliché including a plurality of grooves; filling at least one of the grooves of the cliché with opaque material; and applying the opaque material filled in the at least one of the grooves of the cliché to the color filter film. Applying the opaque material to the color filter film may comprise transferring the opaque material filled in the at least one of the grooves of the cliché to a transfer apparatus; and applying the opaque material to the color filter film using the transfer apparatus. The transfer apparatus may comprise a printing roller, transferring the opaque material filled in the at least one of the grooves to the transfer apparatus may comprise rotating the printing roller on the cliché, and applying the opaque material to the color filter film may comprise rotating the printing roller containing the opaque material on the color filter film. The method may comprise depositing each of the color filter films on the substrate and the opaque matrix using lamination.

Forming the opaque matrix may comprise: providing a cliché including a plurality of grooves; filling at least one of the grooves of the cliché with opaque material to form the opaque matrix; transferring the opaque material filled in the at least one of the grooves of the cliché to a transfer apparatus; and applying the opaque material to the substrate using the transfer apparatus to form the opaque material on the substrate. The opaque material may be filled in each of the grooves of the cliché. The transfer apparatus may comprise a printing roller, transferring the opaque material filled in the at least one of the grooves of the cliché to the transfer apparatus may comprise rotating the printing roller on the cliché, and applying the opaque material to the substrate may comprise rotating the printing roller containing the opaque material on the substrate.

The method further may comprise depositing each of the color filter films on the substrate and the opaque matrix such that a top of any color filter films and patterns on the substrate and the opaque matrix are planar.

The method may further comprise disposing an amount of the opaque material that will more than fill the at least one of the grooves on a surface of the cliché and pulling the opaque material into the at least one of the grooves. In this case, the method may further comprise pulling the opaque material into the at least one of the grooves using a blade to flatten the opaque material into the at least one of the grooves and removing the excess opaque material from the surface of the cliché. The method may further comprise pulling the blade in a direction that is essentially along the longest length of the at least one of the grooves.

In another embodiment, a method for fabricating a color filter of a liquid crystal display (LCD) device comprises: forming a black matrix on a transparent substrate; depositing a red color filter film on the black matrix; printing a first black resin pattern on a first portion of the red color filter film and leaving a second portion of the red color film being free from coverage by the first black resin pattern; irradiating the second portion of the red color filter film; applying developer to the red color filter film to thereby remove the first black resin pattern and the first portion of the red color film and form a red color filter pattern from the second portion of the red color film; depositing a green color filter film on the substrate; printing a second black resin pattern on a first portion of the green color filter film and leaving a second portion of the green color film being free from coverage by the second black resin pattern; irradiating the second portion of the green color film; applying developer to the green color filter film to thereby remove the second black resin pattern and the first portion of the green color film and form a green color filter pattern from the second portion of the green color film; depositing a blue color film on the substrate; printing a third black resin pattern on a first portion of the blue color filter film and leaving a second portion of the blue color film being free from coverage by the third black resin pattern; irradiating the second portion of the blue color filter film; and applying developer to the blue color filter film to thereby remove the third black resin pattern and the first portion of the blue color film and form a blue color filter pattern from the second portion of the blue color film.

The method may further comprise depositing the red, green, and blue color filter films on the substrate by lamination.

Printing of each of the first, second, and third black resin patterns may comprise: providing a cliché including a plurality of grooves; filling a black resin in the grooves of the cliché; transferring the black resin filled in the grooves of the cliché onto a printing roller; and rolling the printing roller coated with the black resin on the color filter films.

The method may further comprise depositing each of the color filter films on the substrate only on portions of the substrate being free from coverage by another of the color filter films.

The foregoing and other features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Reference will now be made in detail to embodiments of the present invention, examples of which are illustrated in the accompanying drawings.

FIGS. 3A through 3H are views showing a fabrication method of a color filter substrate of an LCD device in accordance with one embodiment of the present invention.

Figure 1:
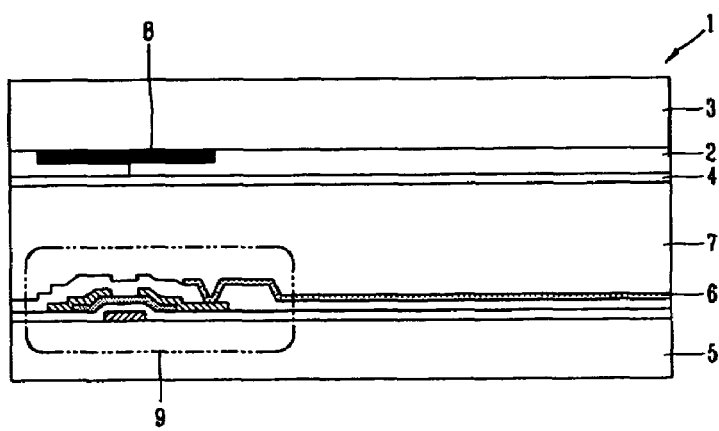
FIG. 1 is a sectional view showing a general LCD device.
Figure 2A:
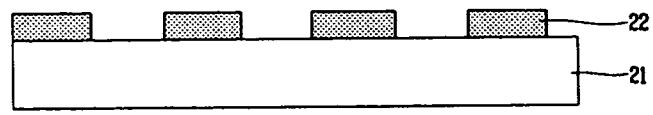
FIGS. 2A to 2D are views showing a fabrication method of a color filter substrate of an LCD device in accordance with the related art.
Figure 2B:
Figure 2C:
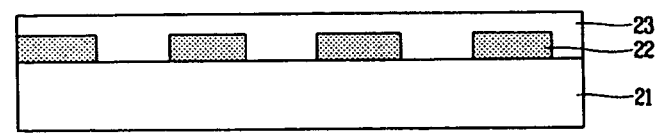
Figure 2D:
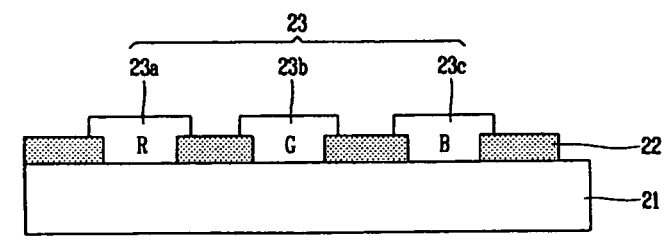
Figure 3A:
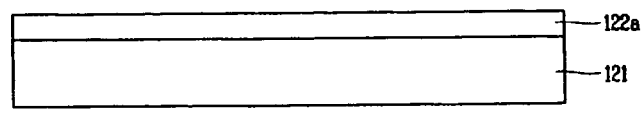
FIGS. 3A to 3H are views showing a fabrication method of a color filter substrate of an LCD device in accordance with one embodiment of the present invention.

First of all, as shown in FIG. 3A, a transparent substrate 121 is provided, and then a red color filter film 122a is deposited on the transparent substrate 121. The red color filter film 122a is deposited on the substrate 121 using lamination.

Figure 3B:
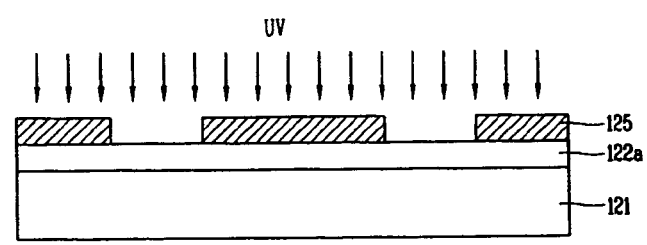

Then, as shown in FIG. 3B, a black resin pattern 125 is formed on the red color filter film 122a using a printing method. The printing method forms a pattern without requiring an additional photolithographic process. First, a cliché in which a groove having the same shape as a pattern to be formed is provided. Then, a resin is filled into the groove, and the filled resin is applied on the substrate thus to form a desired pattern. The resin may be a black resin or may contain an opaque material that is opaque to radiation to irradiate the structure.

Figure 4A:
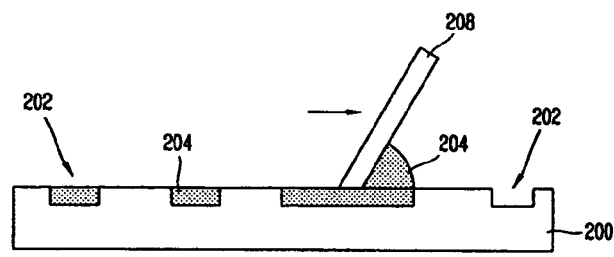
FIGS. 4A to 4C are views showing a printing method of a black resin pattern for fabricating a color filter substrate according to one embodiment of the present invention.
Figure 4B:
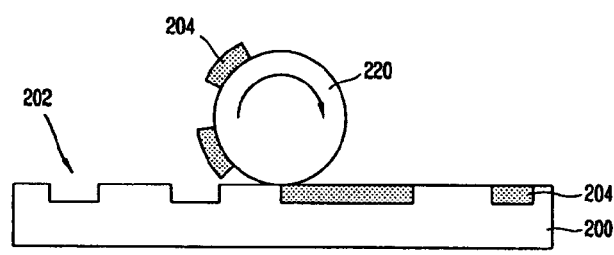
Figure 4C:
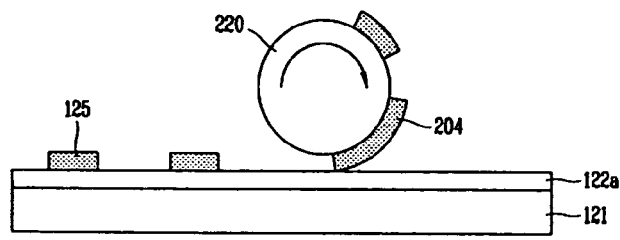

FIGS. 4A, 4B, and 4C shows a fabrication method of the black resin pattern 125 by using the printing method.

As shown in FIG. 4A, after providing a cliché 200 in which grooves 202 are formed in shapes and positions corresponding to a pattern to be formed on a substrate, a black resin 204 or resist is provided to the cliché 200. For example, an amount of resist that will more than fill the grooves 202 is disposed on the surface of the cliché 200 and is pulled into the grooves 202 by a blade 108 to flatten the resist into the grooves and then the excess resist is whisked off. The blade 108 may be pulled in a direction that is essentially along the longest length of groove. Otherwise, if the blade 108 is pulled in a direction perpendicular to or significantly deviates from parallel to longest length of the groove, the resist might not fill the groove 202 smoothly along its longest length such that subsequent processes can remove resist from the cliché 200.

As shown in FIG. 4B, the black resin 204 filled into the groove 202 of the cliché 200 is transferred onto a transfer apparatus. In the embodiment shown, this transfer apparatus is a rotating printing roller 220, of which the black resin 204 is transferred to the surface of the rotating printing roller 220 when the printing roller 220 is rolled across the surface of the cliché 100. The printing roller 220 may have the same width as that of the panel of the display device to be fabricated. Further, the printing roller 220 may have a circumference that is identical to the length of the panel of the display device to be fabricated. In such an embodiment the black resin 204 filled in the groove 202 of the cliché 200 may be applied to the circumferential surface of the printing roller 220 in one rotation.

As shown in FIG. 4C, the black resin 204 transferred to the printing roller 210 is rotated on a surface of a (red) color filter film 122a previously deposited on a substrate 121, so that the black resin 204 transferred on the printing roller 210 is applied onto the red color filter film 122a thus to form the patterned black resin 125. Herein, the black resin pattern 125 can be formed on the entire surface of the red color filter film 122a in a desired shape in one rotation of the printing roller 220.

The pattern forming method is advantageous in that the pattern can be formed by one process and can be formed more easily than the related photolithographic process.

Figure 3C:
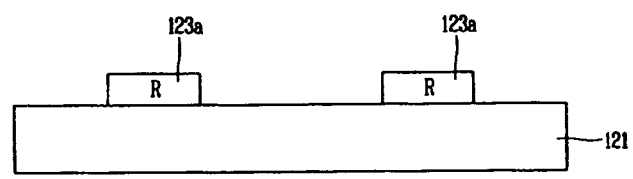

Next, as shown in FIG. 3B, ultraviolet light irradiates the entire surface of the red color filter film 122a. Developer is then applied to the substrate irradiated by the ultraviolet light, as shown in FIG. 3C, forming a red color filter pattern 123a at regions where the black resin pattern 125 is not formed. Where the ultraviolet light has been incident on the red color filter film 122a, the red color filter film 122a is not removed by the developer. However, the red color filter film 122a formed at the regions where the black resin patterns 125 are formed are removed by the developer with the black resin patterns 125 since the ultraviolet light is blocked by the black resin patterns 125. The black resin pattern 125 thus is not formed at regions in which the red color filter pattern 123a is to be formed. Exposure of the color filter films to radiation changes the structure such that the developer acts differently on portions of the color filter film that are exposed to the radiation and portions of the color filter film that are not exposed to the radiation. Thus, in another embodiment, developer can remove both the black resin pattern and the color filter pattern that is exposed to the radiation, permitting formation of the color filter patterns from color filter film underneath the resin pattern.

Figure 3D:
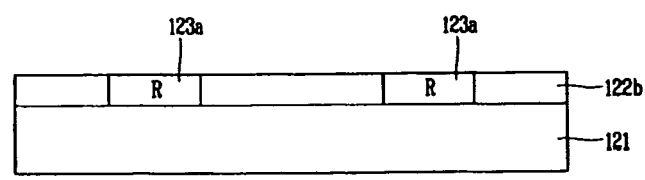

Then, as shown in FIG. 3D, a (green) color filter film 122b is deposited on the substrate 121, but not the portions of the substrate 121 on which the red color filter pattern 123a is formed. This is to say that the green color filter film 122b fills the spaces between the red color filter pattern 123a. Herein, the green color filter film 122a is deposited on the substrate 121 using lamination. The green color filter film 122b is disposed in the areas in which the red color filter pattern 123a is not present.

Figure 3E:
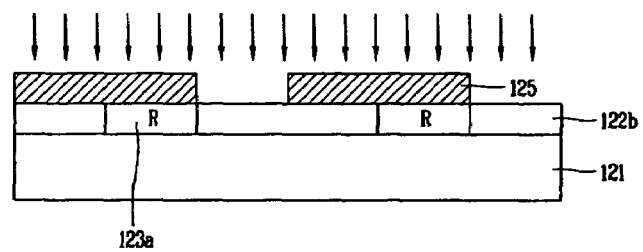
Figure 3F:
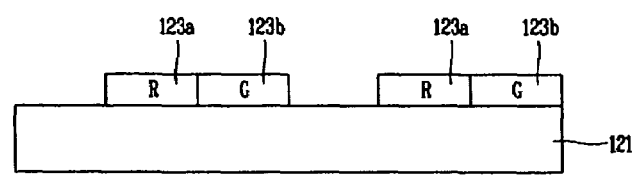

As shown in FIG. 3E, the black resin pattern 125 is subsequently formed on the substrate 121, but not on regions in which the final green color filter pattern is to be formed. At this time, the black resin pattern 125 is formed by using a printing process. Then, ultraviolet light irradiates the entire surface of the substrate 121 on which the black resin pattern 125 is formed. Once again, the black resin pattern 125 blocks the ultraviolet light such that when developer is applied to the substrate 121, the green color filter film 122b formed at the regions where the black resin pattern 125 is formed is removed as well as the black resin pattern 125. Accordingly, as shown in FIG. 3F, a green color filter pattern 123b is formed at the regions where the black resin pattern 125 is not formed.

Figure 3G:
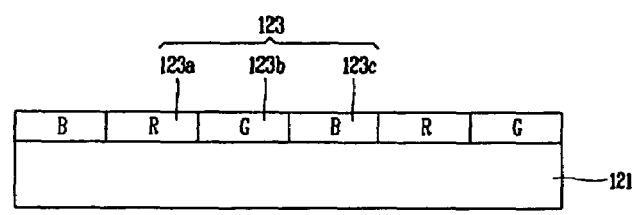

Subsequently, as shown in FIG. 3G, a (blue) color filter film 123c is deposited on the substrate 121 where the red and green color filter films 123a and 123b are formed by using lamination. That is, the blue color filter film 122c is disposed in the areas in which neither the red color filter pattern 123a nor the green color filter pattern 123b is present. Then, the above process is repeated to form a color filter film 123 containing the red, green, and blue color filter patterns 123a, 123b, and 123c.

Figure 3H:
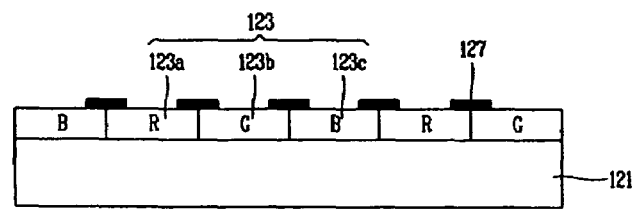

Thereafter, as shown in FIG. 3H, a black matrix 127 is formed on the color filter film 123. The black matrix 127 prevents color mixture and light leakage among each color filter pattern. The black matrix 127 is formed at intersections between the red, green, and blue color filter patterns 123a, 123b, and 123c such that the black matrix 127 overlaps two adjacent color filters. The black matrix 127 can be formed by the above photo mask process or printing method. If the printing method is used, a black resin can be used as the material forming the black matrix 127.

Figure 5:
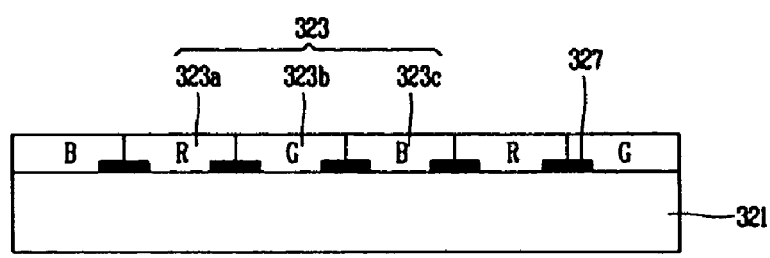
FIG. 5 is a view showing another embodiment of the present invention.

Also, as shown in FIG. 5, the black matrix 327 can be formed before the color filter 323 containing the red, green, and blue color filter patterns 323a, 323b, 323c is formed. That is, a metal material such as Cr or $CrO_x$ (or other such opaque material) is deposited on a substrate 321, and a mask pattern is formed on the metal layer, then the metal material is etched and removed along with the mask pattern thus forming the black matrix 327. The black matrix 327 can also be formed by the printing method described above. The color filter 323 may then formed by using similar techniques as that above, e.g. each of the patterns 323a, 323b, 323c is formed using masking, irradiation, and developing to form the patterns or the patterns 323a, 323b, 323c are formed one by one or all at once by printing using the printing roller. As shown, the tops of any patterns or films on the substrate and black matrix are substantially planar.

The present invention can simplify processes using a printing method when the mask pattern for forming the R, G, and B color filter patterns is formed. That is, previously the color filter film was deposited to form the color filter by repeating the photo mask process to form the R, G, and B color filter patterns. However, in one embodiment of the present invention, the mask pattern of the color filter is formed by using the printing method. The entire surface of the color filter film on which the mask pattern is formed is exposed to radiation and then developed to form the red (R), green (G), and blue (B) color filter patterns. Accordingly, the color filter substrate can be fabricated without using an expensive photo mask, and the printing process can be simplified, thus increasing production efficiency.

While a gravure offset printing method was presented as the printing method of the black resin pattern in the present invention, the present invention is not limited to this method. For example, the black resin pattern can be formed by using screen printing or ink jet printing. The color filter substrate thus may be formed without using the photo mask.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a color filter of a liquid crystal display (LCD) device comprising:
providing a transparent substrate;
depositing a color filter film on the substrate;
forming a mask pattern on the color filter film, a first region of the color filter film being covered by the mask pattern and a second region of the color filter film being free of coverage by the mask pattern, wherein the mask pattern is formed of a black resin; and
removing the first region of the color filter film and the mask pattern.

2. The method of claim 1, further comprising irradiating the color filter film prior to removing the first region of the color filter film.

3. The method of claim 1, further comprising applying developer to the color filter film to remove the first region of the color filter film and the mask pattern.

4. The method of claim 1, wherein forming the mask pattern comprises printing the mask pattern on the color filter film.

5. The method of claim 4, wherein printing the mask pattern comprises:
providing a cliché including a plurality of grooves;
filling at least one of the grooves of the cliché with opaque material; and
applying the opaque material filled in the at least one of the grooves of the cliché to the color filter film.

6. The method of claim 5, wherein applying the opaque material onto the color filter film comprises:
transferring the opaque material filled in the at least one of the grooves of the cliché to a transfer apparatus; and
applying the opaque material to the color filter film using the transfer apparatus.

7. The method of claim 6, wherein the transfer apparatus comprises a printing roller, transferring the opaque material filled in the at least one of the grooves of the cliché to the transfer apparatus comprises rotating the printing roller on the cliché, and applying the opaque material to the color filter film comprises rotating the printing roller containing the opaque material on the color filter film.

8. The method of claim 5, further comprising disposing an amount of the opaque material that will more than fill the at least one of the grooves on a surface of the cliché and pulling the opaque material into the at least one of the grooves.

9. The method of claim 8, further comprising pulling the opaque material into the at least one of the grooves using a blade to flatten the opaque material into the at least one of the grooves and removing the excess opaque material from the surface of the cliché.

10. The method of claim 9, further comprising pulling the blade in a direction that is essentially along the longest length of the at least one of the grooves.

11. The method of claim 1, wherein the color filter film is deposited on the substrate using lamination.

12. The method of claim 1, further comprising forming an opaque matrix on the color filter.

13. The method of claim 12, wherein forming the opaque matrix comprises:
providing a cliché including a plurality of grooves;

filling opaque material into at least one of the grooves of the cliché;

transferring the opaque material filled into the at least one of the grooves of the cliché to a transfer apparatus; and applying the opaque material to the color filter film using the transfer apparatus to form the opaque matrix on the color filter.

14. The method of claim 13, wherein the opaque material is filled in each of the grooves of the cliché.

15. The method of claim 13, wherein the transfer apparatus comprises a printing roller, transferring the opaque material filled in the at least one of the grooves of the cliché to the transfer apparatus comprises rotating the printing roller on the cliché, and applying the opaque material to the color filter film comprises rotating the printing roller containing the opaque material on the color filter film.

16. The method of claim 13, further comprising disposing an amount of the opaque material that will more than fill the at least one of the grooves on a surface of the cliché and pulling the opaque material into the at least one of the grooves.

17. The method of claim 16, further comprising pulling the opaque material into the at least one of the grooves using a blade to flatten the opaque material into the at least one of the grooves and removing the excess opaque material from the surface of the cliché.

18. The method of claim 17, further comprising pulling the blade in a direction that is essentially along the longest length of the at least one of the grooves.

19. A method for fabricating a color filter of a liquid crystal display (LCD) device comprising:

forming an opaque matrix on a transparent substrate;

depositing a plurality of color filter films on the opaque matrix; and after each color filter film is deposited, forming a mask pattern on the color film and removing the mask pattern and a portion of the color film to form a color filter pattern, wherein the mask pattern is formed of a black resin.

20. The method of claim 19, further comprising irradiating each color filter film prior to removing the mask pattern and portion of the color film.

21. The method of claim 20, wherein each mask pattern is formed of an opaque material that is opaque to radiation used to irradiate each color filter film.

22. The method of claim 19, further comprising applying developer to each color filter film to remove the mask pattern and portion of the color film.

23. The method of claim 19, wherein forming the mask pattern comprises printing the mask pattern on each color filter film.

24. The method of claim 23, wherein each mask pattern is printed over different portions of the substrate.

25. The method of claim 24, wherein printing the mask pattern on each color filter film comprises: providing a cliché including a plurality of grooves;

filling at least one of the grooves of the cliché with opaque material; and applying the opaque material filled in the at least one of the grooves of the cliché to the color filter film.

26. The method of claim 25, wherein applying the opaque material to the color filter film comprises:

transferring the opaque material filled in the at least one of the grooves of the cliché to a transfer apparatus; and applying the opaque material to the color filter film using the transfer apparatus.

27. The method of claim 26, wherein the transfer apparatus comprises a printing roller, transferring the opaque material filled in the at least one of the grooves to the transfer apparatus comprises rotating the printing roller on the cliché, and applying the opaque material to the color filter film comprises rotating the printing roller containing the opaque material on the color filter film.

28. The method of claim 26, further comprising pulling the opaque material into the at least one of the grooves using a blade to flatten the opaque material into the at least one of the grooves and removing the-excess opaque material from the surface of the cliché.

29. The method of claim 28, further comprising pulling the blade in a direction that is essentially along the longest length of the at least one of the grooves.

30. The method of claim 25, further comprising disposing an amount of the opaque material that will more than fill the at least one of the grooves on a surface of the cliché and pulling the opaque material into the at least one of the grooves.

31. The method of claim 19, further comprising depositing each of the color filter films on the substrate and the opaque matrix using lamination.

32. The method of claim 19, wherein forming the opaque matrix comprises:

providing a cliché including a plurality of grooves;

filling at least one of the grooves of the cliché with opaque material to form the opaque matrix;

transferring the opaque material filled in the at least one of the grooves of the cliche to a transfer apparatus; and applying the opaque material to the substrate using the transfer apparatus to form the opaque material on the substrate.

33. The method of claim 32, wherein the opaque material is filled in each of the grooves of the cliché.

34. The method of claim 32, wherein the transfer apparatus comprises a printing roller, transferring the opaque material filled in the at least one of the grooves of the cliché to the transfer apparatus comprises rotating the printing roller on the cliché, and applying the opaque material to the substrate comprises rotating the printing roller containing the opaque material on the substrate.

35. The method of claim 32, further comprising disposing an amount of the opaque material that will more than fill the at least one of the grooves on a surface of the cliché and pulling the opaque material into the at least one of the grooves.

36. The method of claim 35, further comprising pulling the opaque material into the at least one of the grooves using a blade to flatten the opaque material into the at least one of the grooves and removing the excess opaque material from the surface of the cliché.

37. The method of claim 36, further comprising pulling the blade in a direction that is essentially along the longest length of the at least one of the grooves.

38. The method of claim 19, further comprising depositing each of the color filter films on the substrate and the opaque matrix such that a top of any color filter films and patterns on the substrate and the opaque matrix are planar.

39. A method for fabricating a color filter of a liquid crystal display (LCD) device comprising:

forming a black matrix on a transparent substrate;

depositing a red color filter film on the black matrix;

printing a first black resin pattern on a first portion of the red color filter film and leaving a second portion of the red color film being free from coverage by the first black resin pattern;

irradiating the second portion of the red color filter film;

applying developer to the red color filter film to thereby remove the first black resin pattern and the first portion of the red color film and form a red color filter pattern from the second portion of the red color film;

depositing a green color filter film on the substrate;

printing a second black resin pattern on a first portion of the green color filter film and leaving a second portion of the green color film being free from coverage by the second black resin pattern;

irradiating the second portion of the green color film;

applying developer to the green color filter film to thereby remove the second black resin pattern and the first portion of the green color film and form a green color filter pattern from the second portion of the green color film;

depositing a blue color film on the substrate;

printing a third black resin pattern on a first portion of the blue color filter film and leaving a second portion of the blue color film being free from coverage by the third black resin pattern;

irradiating the second portion of the blue color filter film; and applying developer to the blue color filter film to thereby remove the third black resin pattern and the first portion of the blue color film and form a blue color filter pattern from the second portion of the blue color film.

40. The method of claim 39, further comprising depositing the red, green, and blue color filter films on the substrate by lamination.

41. The method of claim 39, wherein printing of each of the first, second, and third black resin patterns comprises:

providing a cliché including a plurality of grooves;

filling a black resin in the grooves of the cliché;

transferring the black resin filled in the grooves of the cliché onto a printing roller; and rolling the printing roller coated with the black resin on the color filter films.

42. The method of claim 39, further comprising depositing each of the color filter films on the substrate only on portions of the substrate being free from coverage by another of the color filter films.

* * * * *

UNITED STATES PATENT AND TRADEMARK OFFICE
CERTIFICATE OF CORRECTION

| | | |
|---|---|---|
| PATENT NO. | : 7,169,517 B2 | Page 1 of 1 |
| APPLICATION NO. | : 10/677552 | |
| DATED | : January 30, 2007 | |
| INVENTOR(S) | : Hong-Suk Yoo et al. | |

It is certified that error appears in the above-identified patent and that said Letters Patent is hereby corrected as shown below:

In the Claims

Column 10, in claim 28, line 4, after "grooves and removing" delete "the-excess" and substitute --excess-- in its place.

Signed and Sealed this

First Day of May, 2007

JON W. DUDAS
*Director of the United States Patent and Trademark Office*